(12) United States Patent
Nistler et al.

(10) Patent No.: US 8,072,218 B2
(45) Date of Patent: Dec. 6, 2011

(54) WHOLE-BODY ANTENNA FOR A MAGNETIC RESONANCE SYSTEM COMPRISING HOLLOW RODS

(75) Inventors: Jürgen Nistler, Erlangen (DE); Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 194 days.

(21) Appl. No.: 12/445,537

(22) PCT Filed: Apr. 2, 2008

(86) PCT No.: PCT/EP2008/053944
§ 371 (c)(1),
(2), (4) Date: Apr. 14, 2009

(87) PCT Pub. No.: WO2008/122559
PCT Pub. Date: Oct. 16, 2008

(65) Prior Publication Data
US 2010/0066369 A1  Mar. 18, 2010

(30) Foreign Application Priority Data
Apr. 4, 2007  (DE) .................. 10 2007 016 313

(51) Int. Cl.
*G01V 3/00* (2006.01)
(52) U.S. Cl. ...................................... 324/318
(58) Field of Classification Search .......... 324/300–322; 600/410–435; 333/219–235; 343/767–777.1, 343/787–792, 845–849, 872–873, 896, 900–916
See application file for complete search history.

(56) References Cited

U.S. PATENT DOCUMENTS

| | | | |
|---|---|---|---|
| 4,594,566 A * | 6/1986 | Maudsley | 333/219 |
| 4,617,936 A | 10/1986 | Malko | |
| 5,543,713 A | 8/1996 | Arakawa et al. | |
| 5,557,247 A | 9/1996 | Vaughn, Jr. | |
| 6,100,693 A | 8/2000 | Eberler et al. | |
| 6,812,705 B1 | 11/2004 | Sellers | |
| 6,943,551 B2 * | 9/2005 | Eberler et al. | 324/318 |
| 7,068,035 B2 * | 6/2006 | Nistler et al. | 324/322 |
| 7,268,550 B2 * | 9/2007 | Greim | 324/318 |
| 7,477,056 B2 * | 1/2009 | Renz | 324/318 |
| 7,501,826 B2 * | 3/2009 | Eberler et al. | 324/322 |
| 7,518,367 B2 * | 4/2009 | Renz et al. | 324/318 |
| 7,551,147 B2 * | 6/2009 | Reykowski | 343/900 |
| 7,764,065 B2 * | 7/2010 | Biber et al. | 324/318 |
| 7,847,554 B2 * | 12/2010 | Nistler et al. | 324/318 |
| 2002/0135371 A1 | 9/2002 | Renz | |
| 2009/0267606 A1 * | 10/2009 | Lazar et al. | 324/318 |

FOREIGN PATENT DOCUMENTS
WO  WO 2006/000928  1/2006
WO  WO 2006/083364  8/2006
* cited by examiner Primary Examiner — Dixomara Vargas
(74) Attorney, Agent, or Firm — Schiff Hardin LLP

(57) ABSTRACT

A whole-body antenna for a magnetic resonance apparatus has an antenna structure composed of a number of antenna rods extending in a rod direction between first and second ends of the antenna structure. The antenna rods are distributed around a central axis of the antenna structure, forming an examination region for an examination subject in a magnetic resonance examination. The antenna rods are coupled to each other at their first ends by a ferrule. Each of the rods is a hollow rod, and each rod is connected at its second end to ground via a hollow ring. Conductors are routed in the interior of the hollow rods, and can be routed through the hollow ring to the exterior of the antenna structure.

5 Claims, 2 Drawing Sheets

WHOLE-BODY ANTENNA FOR A MAGNETIC RESONANCE SYSTEM COMPRISING HOLLOW RODS

BACKGROUND OF THE INVENTION

Field of the Invention

The present invention concerns a whole-body antenna for a magnetic resonance system,
  wherein the whole-body antenna possesses an antenna structure,
  wherein the antenna structure possesses multiple antenna rods respectively extending in a rod direction from a first end to a second end,
  wherein the antenna rods are arranged distributed around a central axis so that they form an examination region for an examination subject to be excited to magnetic resonance,
  wherein the antenna rods are coupled with one another at their first ends by means of a ferrule.

Whole-body antennas of the type described above and magnetic resonance systems of the type described above are generally known. In the known whole-body antennas, the antenna structure has an additional ferrule with which the antenna rods are coupled with one another at their second ends.

SUMMARY OF THE INVENTION

An object of the present invention is provide a magnetic resonance whole-body antenna that allows conductors to be directed in a simple manner that are required for auxiliary elements integrated into the antenna rods.

In accordance with the present invention, the whole-body antenna for a magnetic resonance system has an antenna structure composed of multiple antenna rods each extending in a rod direction from a first end to a second end of the antenna structure. The antenna rods are distributed around a central axis of the antenna structure, so as to form an examination region that accommodates an examination subject in a magnetic resonance examination. The antenna rods are coupled with each other at their first ends by a ferrule.

According to the invention, the antenna rods are fashioned as hollow rods and are connected to ground at their second ends via a hollow ring so that conductors directed inside the hollow rods can be directed to the outside of the antenna structure via the hollow ring.

The conductors directed inside the hollow rods can be electrical conductors and/or hollow conduits for a free-flowing medium.

In a preferred embodiment, the antenna rods are parallel to the central axis.

DESCRIPTION OF THE PREFERRED EMBODIMENTS

Figure 1:
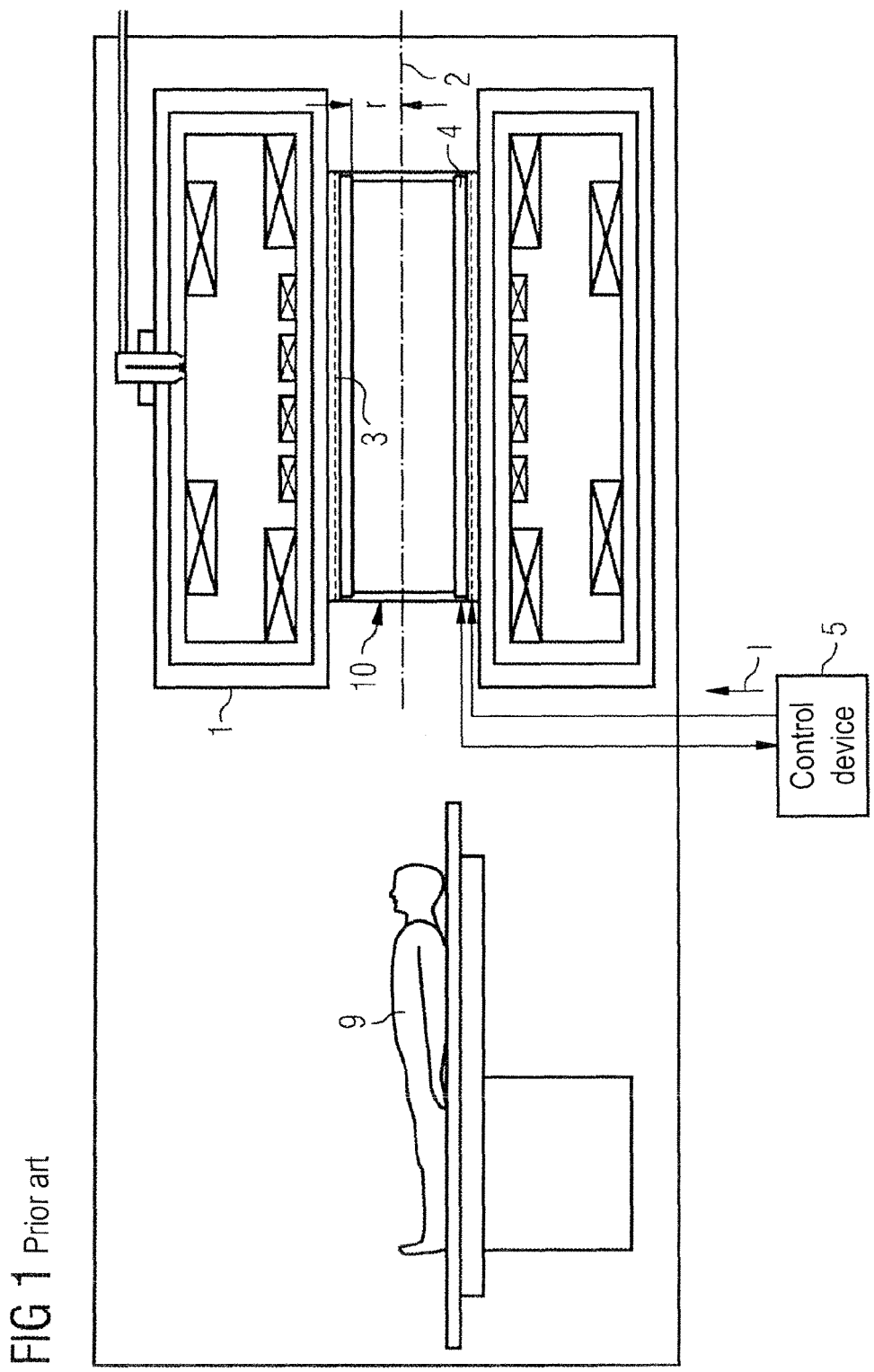
FIG. 1 schematically illustrates the basic components of a conventional magnetic resonance system.

According to FIG. 1, a magnetic resonance system has a basic magnet 1. The basic magnet 1 is fashioned essentially as a cylinder so that it surrounds the central axis 2.

Insofar as the terms "axial", "radial" and "tangential" are used in the following, they always refer to an axis, for example the central axis 2. The term "axial" indicates a direction parallel to the respective axis. The terms "radial" and "tangential" mean directions in a plane orthogonal to the respective axis. The term "radial" refers to a direction in this plane that is directed towards or, respectively, away from the respective axis.

The term "tangential" designates a direction around the axis in the plane orthogonal to the axis. If the terms "axial", "radial" and "tangential" are used without explicit reference to an axis, they refer to the central axis 2. If they should refer to a different axis, this axis is designated.

A gradient coil 3 is arranged radially within the basic magnet 1. A whole-body antenna 4 is arranged radially within the gradient coil 3. The whole-body antenna 4—like the gradient coil 3 and the basic magnet 1—extends tangentially around the central axis 2.

The magnetic resonance system has a control device 5. The gradient coil 3 and the whole-body antenna 4 are controlled by the control device 5.

The whole-body antenna 4 has an antenna structure 6 (see also FIGS. 2 and 3) that extends at a radial distance r around the central axis 2. The antenna structure 6 has a number of antenna rods 7 that are distributed around the central axis 2.

The number of antenna rods 7 is 4 at a minimum. There are normally 16 or 32. However, other numbers of antenna rods 7 are also possible, for example 6, 8, 12, 24 or 40 antenna rods 7. The antenna rods 7 respectively extend in the direction of rod axes 8 from a first end 7' to a second end 7".

In the normal case, the antenna rods 7 are parallel to the central axis 2. However, advantageous embodiments are possible in which the rod axes 8 define a direction that is substantially parallel only to the central axis 2.

In this latter cited case, the respective rod axis 8 exhibits a direction that has a first partial component and a second partial component. The two partial components complement the direction of the respective rod axis 8. The first partial component is (exactly) parallel to the central axis 2. The second partial component is orthogonal to the central axis 2. As long as the first partial component is greater than the second partial component, the direction of the rod axis 8 is essentially parallel to the central axis 2.

For example, a curve of the rod axes 8 essentially parallel only to the central axis 2 can result in that the antenna structure 6 is fashioned slightly conical, and/or that the antenna rods 7 orbit slightly helically around the central axis 2, similar to lands and riflings of a firearm. A combination of these two measures is also possible.

The whole-body antenna 4 is normally operable both as a transmission antenna and as a reception antenna. In transmission operation, the antenna rods 7 are charged by the control device 5 with radio-frequency transmission currents I via corresponding amplifiers. Due to the charging with the transmission currents I, the antenna rods 7 emit excitation signals by means of which an examination subject 9 can be excited to magnetic resonance. For this purpose the examination subject 9 must be arranged inside 10 the antenna structure 6. The inside 10 of the antenna structure 6 thus forms an examination region 10.

The antenna rods 7 are coupled with one another at their first ends 7' by means of a ferrule 11. The antenna rods 7 are normally capacitively coupled with one another via the ferrule 11. For this purpose, capacitors 12 can be arranged in the transition region from the antenna rods 7 to the ferrule 11 and/or in the ferrule 11.

Figure 2:
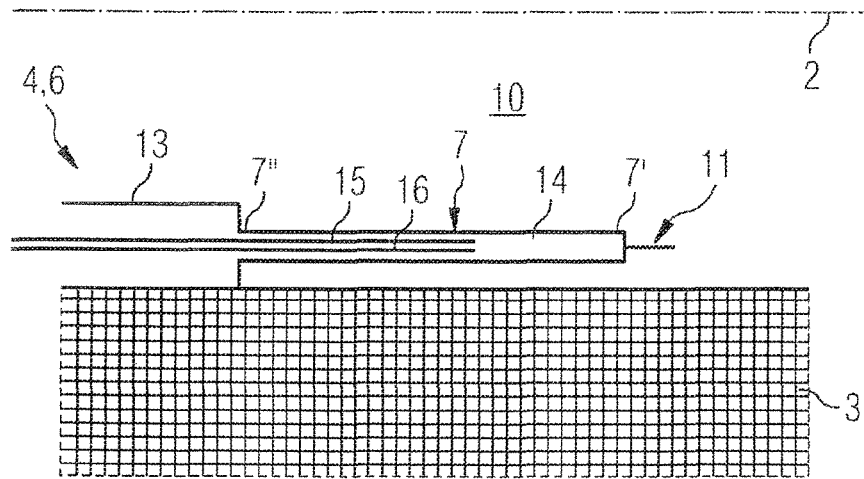
FIG. 2 shows a portion of the magnetic resonance system of FIG. 1.
Figure 3:
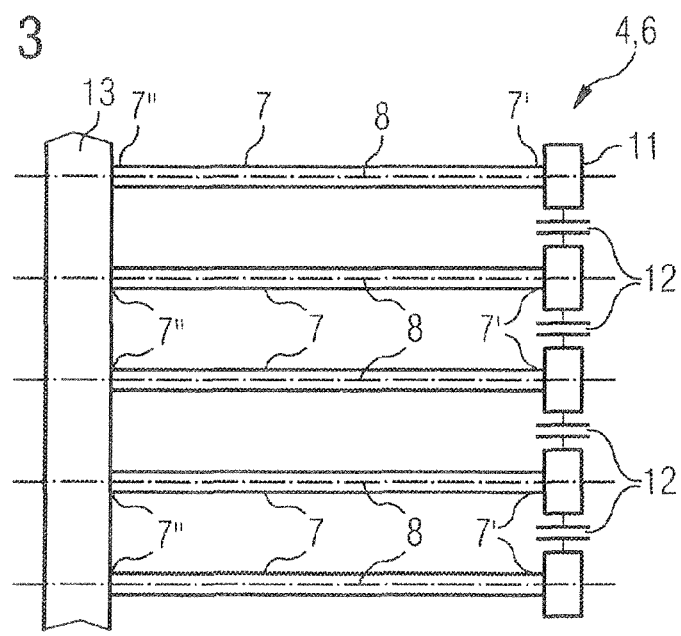
FIG. 3 is a section through a whole-body antenna in accordance with the present invention, in an "unrolled" illustration.

According to FIGS. 2 and 3, the antenna rods 7 are connected to ground at their second ends 7" via a hollow ring 13. According to FIG. 4, the antenna rods 7 themselves are also fashioned as hollow rods 7. It is therefore possible to direct conductors 15, 16 inside 14 the hollow rods 7.

Figure 4:
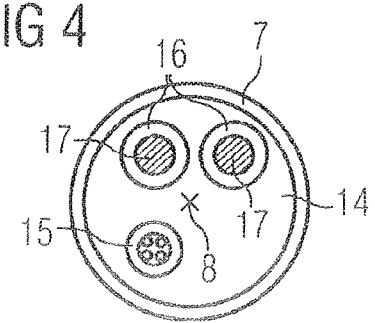
FIG. 4 is a cross-section through an antenna rod of the whole-body antenna according to the present invention.

According to FIG. 4, the conductors 15, 16 can comprise electrical conductors 15, for example, via which the (for example) electronic function elements are supplied with electrical energy and control signals and/or signals delivered from the electronic function elements are tapped. PET detectors are an example of possible electronic function elements. The electronic function elements can be integrated into the antenna rods 7. They are not shown in FIG for clarity.

As an alternative or in addition to the electrical conductors 15, the conductors 15, 16 can comprise hollow conduits in which a free-flowing medium 17 (for example cooling water) is directed.

According to FIGS. 2 and 3, the conductors 15, 16 directed inside 14 the hollow rods 7 can be directed to the outside of the antenna structure 6 via the hollow ring 13. The conductors 15, 16 are shielded in this manner against the radio-frequency field of the whole-body antenna 4.

The present invention offers many advantages. In particular, it can be realized simply and operated flexibly.

Although modifications and changes may be suggested by those skilled in the art, it is the intention of the inventors to embody within the patent warranted heron all changes and modifications as reasonably and properly come within the scope of their contribution to the art.

The invention claimed is:

1. A whole-body antenna for a magnetic resonance system, comprising:
   an antenna structure formed by a plurality of antenna rods, each extending in a rod direction from a first end of the antenna structure to a second, opposite end of the antenna structure;
   said antenna structure having a central axis around which said antenna rods are distributed to form an examination region, surrounded by said antenna rods, of a size to accommodate an examination subject in a magnetic resonance examination;
   said antenna structure comprising a ferrule connecting said antenna rods with each other at the respective first ends of said antenna rods; and
   each of said antenna rods being a hollow rod and being connected to ground at the second end via a hollow ring, and at least some of said antenna rods containing a conductor in the hollow rod, said conductor being directable to an exterior of said antenna structure via the hollow ring of the hollow rod containing the conductor.

2. A whole-body antenna as claimed in claim 1 wherein said conductors inside said hollow rods are electrical conductors.

3. A whole-body antenna as claimed in claim 1 wherein said conductors inside said hollow rods are hollow conduits for a free-flowing medium.

4. A whole body antenna as claimed in claim 1 wherein said antenna rods are all disposed substantially parallel to said central axis.

5. A magnetic resonance system comprising:
   a basic field magnet having an examination volume therein;
   a whole-body antenna comprising an antenna structure formed by a plurality of antenna rods, each extending in a rod direction from a first end of the antenna structure to a second, opposite end of the antenna structure, said antenna structure having a central axis around which said antenna rods are distributed to form an examination region, surrounded by said antenna rods, of a size to accommodate an examination subject in a magnetic resonance examination, said antenna structure comprising a ferrule connecting said antenna rods with each other at the respective first ends of said antenna rods, and each of said antenna rods being a hollow rod and being connected to ground at the second end via a hollow ring, and at least some of said antenna rods containing a conductor in the hollow rod, said conductor being directable to an exterior of said antenna structure via the hollow ring of the hollow rod containing the conductor;
   a gradient coil disposed radially, relative to said central axis within said basic field magnet and radially surrounding said antenna structure; and
   a control unit connected to said antenna structure and to said gradient coil system that operates said whole-body antenna and said gradient coil system to acquire magnetic resonance data from the examination subject in the examination volume.

* * * * *